(12) United States Patent
Park et al.

(10) Patent No.: US 11,480,984 B2
(45) Date of Patent: Oct. 25, 2022

(54) LOW DROPOUT VOLTAGE REGULATOR AND DRIVING METHOD OF LOW DROPOUT VOLTAGE REGULATOR

(71) Applicant: MagnaChip Semiconductor, Ltd., Cheongju-si (KR)

(72) Inventors: Ju Sang Park, Cheongju-si (KR); Hyung Sun Kim, Cheongju-si (KR); Hyoung Kyu Kim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 43 days.

(21) Appl. No.: 16/855,533

(22) Filed: Apr. 22, 2020

(65) Prior Publication Data

US 2021/0026385 A1    Jan. 28, 2021

(30) Foreign Application Priority Data

Jul. 23, 2019    (KR) .......................... 10-2019-0088934

(51) Int. Cl.
*G05F 1/575*    (2006.01)
*G05F 1/569*    (2006.01)
*H03K 19/20*    (2006.01)

(52) U.S. Cl.
CPC .............. *G05F 1/575* (2013.01); *G05F 1/569* (2013.01); *H03K 19/20* (2013.01)

(58) Field of Classification Search
None
See application file for complete search history.

(56) References Cited

U.S. PATENT DOCUMENTS

| 6,664,773 B1* | 12/2003 | Cunnac | G05F 1/575 323/277 |
| 7,064,532 B1* | 6/2006 | Suzuki | G05F 1/573 323/276 |
| 7,092,226 B2* | 8/2006 | Haraguchi | G05F 1/573 361/18 |
| 8,169,202 B2* | 5/2012 | Chen | G05F 1/5735 323/273 |

(Continued)

FOREIGN PATENT DOCUMENTS

| KR | 10-2013-0073744 A | 7/2013 |
| KR | 10-1347538 B1 | 1/2014 |

*Primary Examiner* — Thomas J. Hiltunen
(74) *Attorney, Agent, or Firm* — NSIP Law

(57) ABSTRACT

A low dropout voltage regulator includes a differential amplifier configured to output an amplified voltage by comparing a feedback voltage with a reference voltage, a pass transistor configured to receive a power input voltage into a source terminal, the amplified voltage into a gate terminal, and output an output voltage into a drain terminal, distribution resistors connected between the drain terminal and the ground terminal, configured to generate the feedback voltage, and an inrush preventer, connected in parallel between the differential amplifier and the pass transistor, and configured to output a regulated amplified voltage into the gate terminal according to a control signal, wherein the inrush preventer comprises a determiner configured to output an enable signal that is turned on during an initial driving period, and a limiter configured to output the regulated amplified voltage according to the enable signal.

20 Claims, 14 Drawing Sheets

(56) References Cited

U.S. PATENT DOCUMENTS

| | | | | |
|---|---|---|---|---|
| 8,536,845 B2* | 9/2013 | Kim | ............................ | G05F 1/56 |
| | | | | 323/276 |
| 8,564,263 B2* | 10/2013 | Chen | ........................ | G05F 1/573 |
| | | | | 323/277 |
| 8,866,456 B2* | 10/2014 | Kadanka | .................... | G05F 1/56 |
| | | | | 323/280 |
| 9,000,742 B2* | 4/2015 | Chen | ........................ | G05F 1/575 |
| | | | | 323/275 |
| 9,886,045 B2* | 2/2018 | Endo | .......................... | G05F 1/575 |
| 10,084,311 B2* | 9/2018 | Yuk | ............................ | H02J 1/10 |
| 10,496,117 B1* | 12/2019 | Ogura | ..................... | G05F 1/575 |
| 2008/0030177 A1* | 2/2008 | Chen | ........................... | G05F 1/46 |
| | | | | 323/282 |
| 2015/0137781 A1* | 5/2015 | Qu | ............................ | G05F 1/56 |
| | | | | 323/280 |

* cited by examiner

LOW DROPOUT VOLTAGE REGULATOR AND DRIVING METHOD OF LOW DROPOUT VOLTAGE REGULATOR

CROSS-REFERENCE TO RELATED APPLICATIONS

This application claims the benefit under 35 USC 119(a) of Korean Patent Application No. 10-2019-0088934 filed on Jul. 23, 2019 in the Korean Intellectual Property Office, the entire disclosure of which is incorporated herein by reference for all purposes.

BACKGROUND

1. Field

The following description relates to a low dropout voltage regulator. The following description also relates to a driving method of a low dropout voltage regulator.

2. Description of Related Art

Low dropout voltage regulators, hereinafter referred to as LDO regulators, are devices that may regulate the high power voltage that is inputted into a power source to have an appropriate level of output voltage for an internal device in a power supply module of the electronic devices.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a low dropout voltage regulator includes a differential amplifier configured to output an amplified voltage by comparing a feedback voltage with a reference voltage, a pass transistor configured to receive a power input voltage into a source terminal, the amplified voltage into a gate terminal, and output an output voltage into a drain terminal, distribution resistors connected between the drain terminal and the ground terminal, configured to generate the feedback voltage, and an inrush preventer, connected in parallel between the differential amplifier and the pass transistor, and configured to output a regulated amplified voltage into the gate terminal according to a control signal, wherein the inrush preventer includes a determiner configured to output an enable signal that is turned on during an initial driving period, and a limiter configured to output the regulated amplified voltage according to the enable signal.

The limiter may include a first switch having one end connected to a first node, and configured to be turned on and off according to the enable signal, a first transistor having a gate terminal connected to the gate terminal of the pass transistor, a source terminal connected to the power input voltage terminal, and a drain terminal connected to the first node, and configured to generate a first mirroring current of the amplified voltage, a first resistor configured to generate a first voltage using the first mirroring current, a second transistor having a drain terminal connected to a second node, a source terminal connected to a ground terminal, and a gate terminal connected to the first node, and configured to generate a second mirroring current of the first voltage, a second resistor having one end connected to the second node and configured to generate a second voltage from the second mirroring current, a second switch connected between the power input voltage terminal and another end of the second resistor, and configured to be turned on and off according to the enable signal, a third switch having one end connected to the power input voltage terminal, and configured to be switched on and off according to the enable signal, and a third transistor having a gate terminal connected to the second node, a drain terminal connected to the third node, and a source terminal connected to another end of the third switch, and configured to output the regulated amplified voltage, based on the second voltage, into the gate terminal of the pass transistor.

The limiter may include a first switch having one end connected to a first node, and configured to be turned on and off according to the enable signal, a first transistor having a gate terminal connected to the gate terminal of the pass transistor, a source terminal connected to the power input voltage terminal, and configured to generate a first mirroring current of the amplified voltage, a first switch connected between the drain terminal of the first transistor and the first node and configured to be turned on and off according to the enable signal, a second transistor having a source terminal connected to the ground terminal, a drain terminal connected to one end of the first switch, and a gate terminal connected to the first node, and configured to generate a first voltage according to the first mirroring current, a third transistor having a drain terminal connected to a second node, a source terminal connected to the ground terminal, and a gate terminal connected to the first node, and configured to generate a second mirroring current according to the first voltage, a fourth transistor having a drain terminal and a gate terminal connected to the second node, configured to generate a second voltage from the second mirroring current, a second switch connected between the power input voltage terminal and a source terminal of the fourth transistor, and configured to be turned on and off according to the enable signal, a third switch having one end connected to the power input voltage terminal and configured to be turned on and off according to the enable signal, and a fifth transistor having a gate terminal connected to the second node, a drain terminal connected to a third node, and a source terminal connected to another end of the third switch, and configured to output the regulated amplified voltage, based on the second voltage, into the gate terminal of the pass transistor.

The determiner may include a first inverter configured to invert a received inrush disable signal, and a NAND gate configured to receive an inrush enable signal, an amplifier enable signal, and the inversion inrush disable signal, and configured to output the enable signal.

The determiner may include a NAND gate configured to receive an inrush enable signal, an amplifier enable signal, and an inrush disable signal, and configured to output the enable signal.

The determiner may include a first inverter configured to receive and configured to invert a detection signal, and a NAND gate configured to receive an inrush enable signal, an amplifier enable signal and the inversion detection signal, and configured to output the enable signal.

The determiner may include a NOR gate configured to receiving a detection signal and an inrush disable signal, and a NAND gate configured to receive an inrush enable signal, an amplifier enable signal, and an output signal of the NOR gate, and configured to output the enable signal.

The determiner may include a first inverter configured to receive and to invert a delay signal and a NAND gate configured to receive an inrush enable signal, an amplifier enable signal, and the inversion delay signal, and configured to output the enable signal.

In another general aspect, a driving method of the low dropout voltage regulator includes outputting an output voltage of the low dropout voltage regulator based on a regulated amplified voltage according to a control signal during an initial driving period, comparing a feedback voltage based on the output voltage of the low dropout voltage regulator with a preset reference voltage when the initial driving period elapses, and differentially amplifying a comparison signal to output the output voltage, wherein the control signal includes an inrush enable signal and an amplifier enable signal.

The initial driving period may last from a time at which the inrush enable signal and the amplifier enable signal are turned on to a time at which an inrush disable signal is turned on.

The initial driving period may last from a time at which the inrush enable signal and the amplifier enable signal are turned on to a time at which a detection signal is turned on, and the detection signal may be turned on in response to the output voltage reaching a preset threshold voltage after the driving of the low dropout voltage regulator.

The initial driving period may end in response to the inrush disable signal being turned on after a predetermined time from the detection signal is turned on elapses.

The initial driving period may last from a time at which the inrush enable signal and the amplifier enable signal are turned on to a time at which a delay signal is turned on, and the delay signal may be turned on after a build-up time of the pass transistor elapses.

In another general aspect, a low dropout voltage regulator includes a differential amplifier configured to output an amplified voltage by comparing a feedback voltage with a reference voltage, a pass transistor configured to receive a power input voltage into a source terminal, the amplified voltage into a gate terminal and output an output voltage into a drain terminal, distribution resistors connected between the drain terminal and the ground terminal to generate the feedback voltage, and an inrush preventer connected in parallel between the differential amplifier and the pass transistor and outputting a regulated amplified voltage to the gate terminal according to a control signal, comprising a determiner that outputs a enable signal which is turned on during an initial driving period, and a limiter configured to be turned on and off based on the enable signal in order to control the amplified voltage.

The determiner may include a first inverter configured to invert a received inrush disable signal, and a NAND gate configured to receive an inrush enable signal, an amplifier enable signal, and the inversion inrush disable signal, and configured to output the enable signal.

The determiner may include a NAND gate configured to receive an inrush enable signal, an amplifier enable signal, and an inrush disable signal, and configured to output the enable signal.

The determiner may include a first inverter configured to receive and configured to invert a detection signal, and a NAND gate configured to receive an inrush enable signal, an amplifier enable signal and the inversion detection signal, and configured to output the enable signal.

The determiner may include a NOR gate configured to receiving a detection signal and an inrush disable signal, and a NAND gate configured to receive an inrush enable signal, an amplifier enable signal, and an output signal of the NOR gate, and configured to output the enable signal.

The determiner may include a first inverter configured to receive and to invert a delay signal, and a NAND gate configured to receive an inrush enable signal, an amplifier enable signal, and the inversion delay signal, and configured to output the enable signal.

The limiter may include switches and transistors connected to one another and configured to output the regulated amplified voltage into the gate terminal of the pass transistor.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
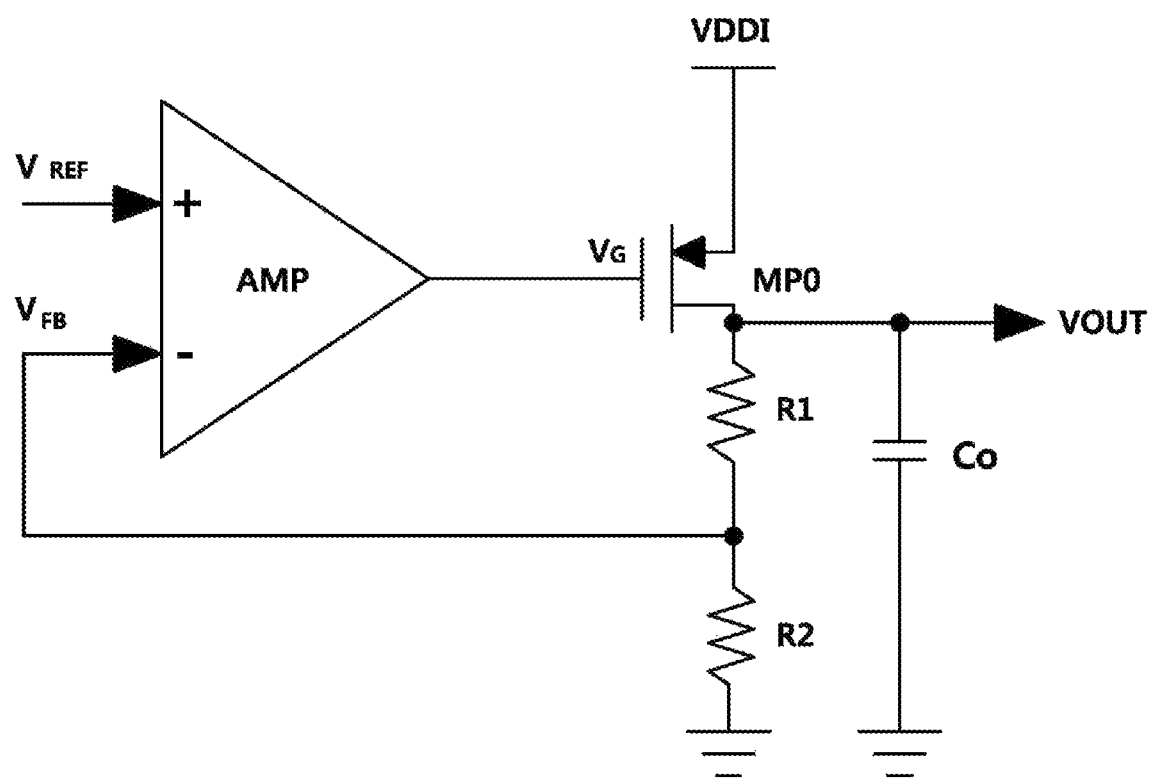
FIG. 1 is a block diagram illustrating a typical low dropout voltage regulator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The features of the examples described herein may be combined in various ways as will be apparent after an understanding of the disclosure of this application. Further, although the examples described herein have a variety of configurations, other configurations are possible as will be apparent after an understanding of the disclosure of this application.

The following description pertains to examples that are provided to protect a circuit by preventing an inrush current of a low dropout voltage regulator, and a circuit for controlling a gate of a pass transistor during the initial driving of the low dropout voltage regulator.

FIG. 1 is a block diagram illustrating a low dropout voltage regulator of a typical technology.

As illustrated in the example of FIG. 1, a typical low dropout voltage regulator may include a pass transistor MP0 that bypasses the input voltage VDDI supplied to a power input terminal through the power output terminal VOUT, as well as maintain the voltage of the power output terminal VOUT to be a constant voltage, by having the output voltage of the power output terminal VOUT be controlled by the output voltage of the differential amplifier AMP that is supplied to the gate electrode, resistors R1 and R2 used for dividing the output voltage of the power output terminal VOUT, and a differential amplifier AMP that compares the divided feedback voltage $V_{FB}$ with a preset reference voltage $V_{REF}$, and maintains the power output voltage VOUT passed to the power output terminal to be a constant voltage, by supplying an amplified voltage that is an amplified differential voltage.

Therefore, when the pass transistor MP0 bypasses the input voltage VDDI supplied to the power input terminal to provide the output voltage VOUT through the power output terminal, the pass transistor MP0 may be controlled by the amplified voltage $V_G$ of the differential amplifier AMP that is supplied into the gate electrode, so that the output voltage VOUT outputted to the power output terminal may be maintained as having a constant voltage.

When a voltage drop regulator is initiated, the pass transistor MP0 may have the smallest resistance value, and the inrush current that is the peak current may charge capacitor Co of the output terminal through the power output terminal. The inrush current may be enough to break the circuit, damaging not only the low dropout regulator, but also possibly damaging the devices connected to the low dropout regulator.

Figure 2:
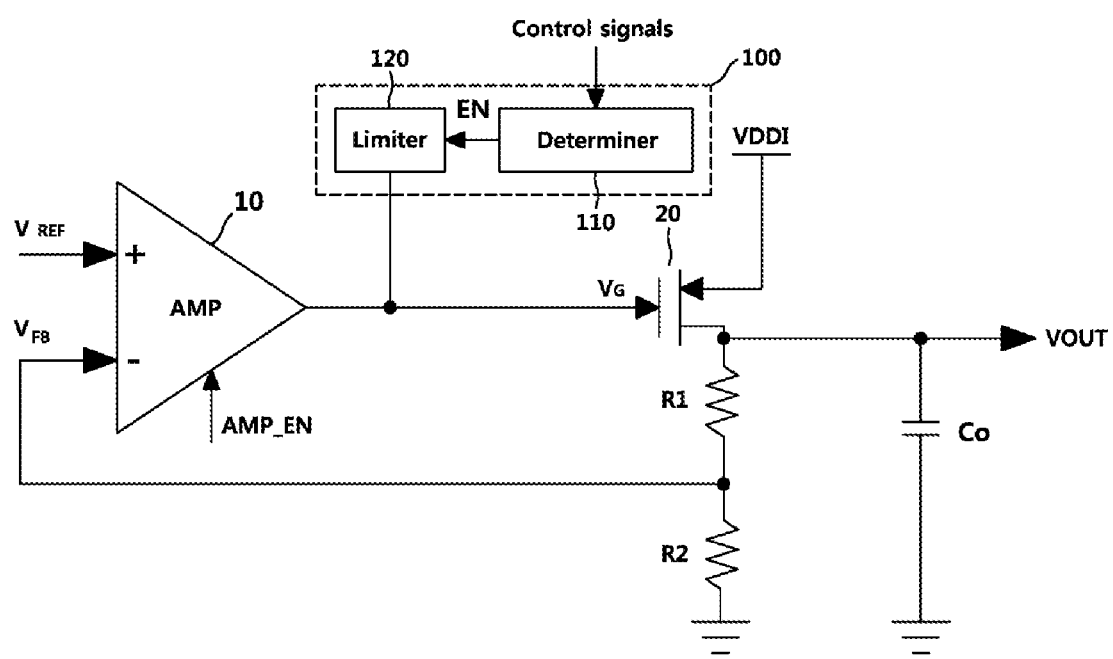
FIG. 2 illustrates a low dropout voltage regulator circuit according to an example.

FIG. 2 illustrates a low dropout voltage regulator circuit according to an example.

With reference to the example of FIG. 2, the low dropout voltage regulator, hereinafter LDO circuit, may include a differential amplifier 10, an inrush preventer 100, a pass transistor 20, distribution resistors R1, R2 and an output capacitor Co, as a non-limiting example. However, these are only example elements, and other examples may include other elements in addition to or instead of these enumerated elements.

The differential amplifier 10 may receive the reference voltage $V_{REF}$ and the feedback voltage $V_{FB}$ and may output the amplified voltage $V_G$ into the gate terminal of the pass transistor 20.

The inrush preventer 100 may be connected in parallel between the differential amplifier 10 and the gate terminal of the pass transistor 20. The inrush preventer 100 may also output regulated amplified voltage according to control signals to the gate terminal of the pass transistor 20. The control signals may be signals supplied from internal logic or an external device or may be feedback signals generated based on the output voltage VOUT. For example, the control signal may include at least three of an amplifier enable signal AMP_EN, an inrush enable signal VDD_INRL_EN, an inrush disable signal VDD_INRL_TOFF, a detection signal VDD_DET, and a delay signal Delay_VDD.

The control signal may include a plurality of signals set according to a predetermined value for the expected inrush current and voltage of the LDO circuit.

The differential amplifier 10 may operate according to the amplifier enable signal AMP_EN illustrated in the example of FIG. 2 that is included in the control signal.

The pass transistor 20 may receive a power input voltage VDDI into a source input, an output voltage VOUT into a drain output, and an amplified voltage $V_G$ into a gate terminal.

In the output terminal of the LDO circuit, the output capacitor Co and the distribution resistors R1 and R2 may be connected in parallel to each other, and the distribution resistors R1 and R2 may divide the output voltage of the LDO circuit in order to output the feedback voltage $V_{FB}$ of the differential amplifier.

The inrush preventer 100 may output the regulated amplified voltage $V_G$ according to the control signals, and may include a determiner 110 and a limiter 120.

The determiner 110 may controls the limiter 120 by outputting an enable signal EN, based on the control signals. The enable signal EN may be turned on during the initial driving period of the LDO circuit.

The limiter 120 may be turned on and off based on the enable signal and the inversion enable signal EN, $\overline{EN}$ 0 that are output from the determiner 110 in order to control the amplified voltage $V_G$ of the gate terminal of the pass transistor 20. In the example of FIG. 1, by comparison, an inrush current may be introduced during an initial driving of the LDO circuit. When an inrush current is generated, a current greater than the low dropout voltage regulator or a device connected to it may be able to tolerate may flows in, so that the device receiving the output voltage of the LDO circuit may malfunction or be damaged, accordingly.

As illustrated in the example of FIG. 2, an example may include an inrush preventer 100 in front of the gate input of the pass transistor 20, so that the inrush current may be prevented from being introduced, and the output voltage VOUT may gradually increase, thereby decreasing the increase amount per unit time of the output voltage VOUT.

Figure 3:
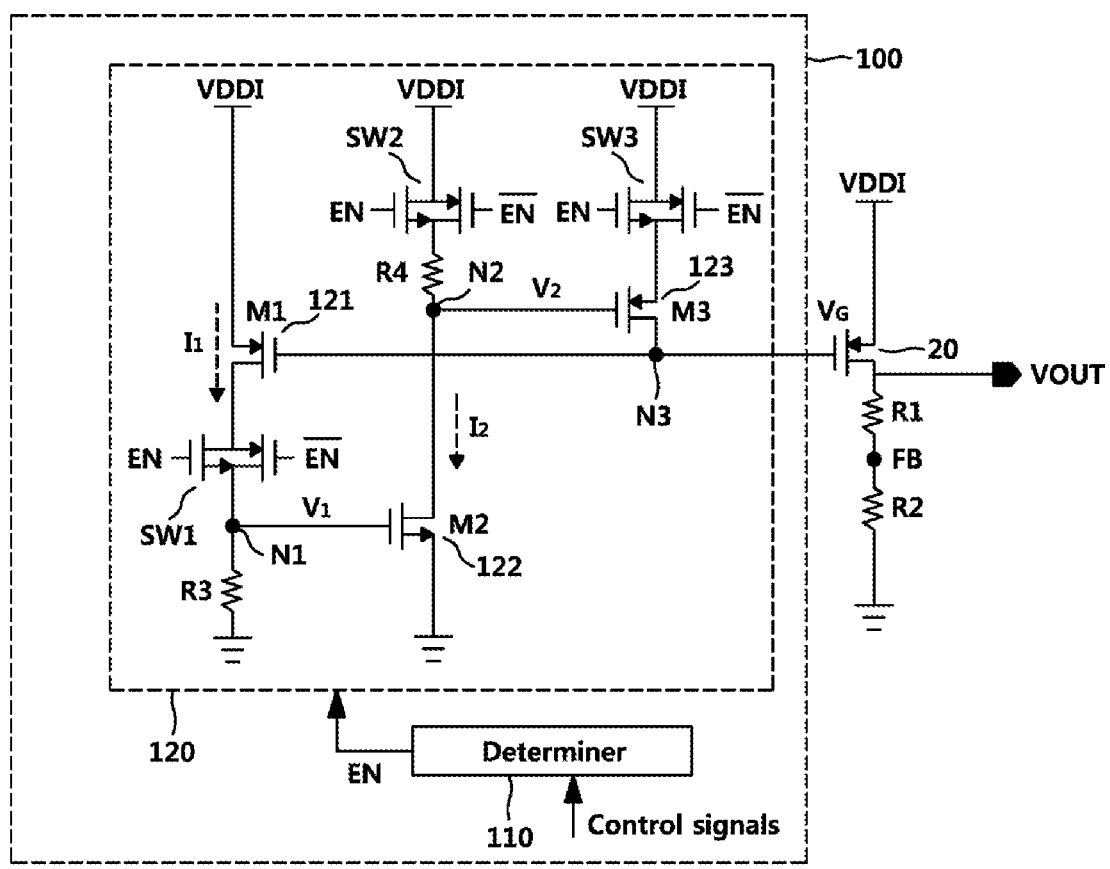
FIG. 3 illustrates an example of the limiter of the inrush preventer illustrated in the example of FIG. 2.
Figure 4:
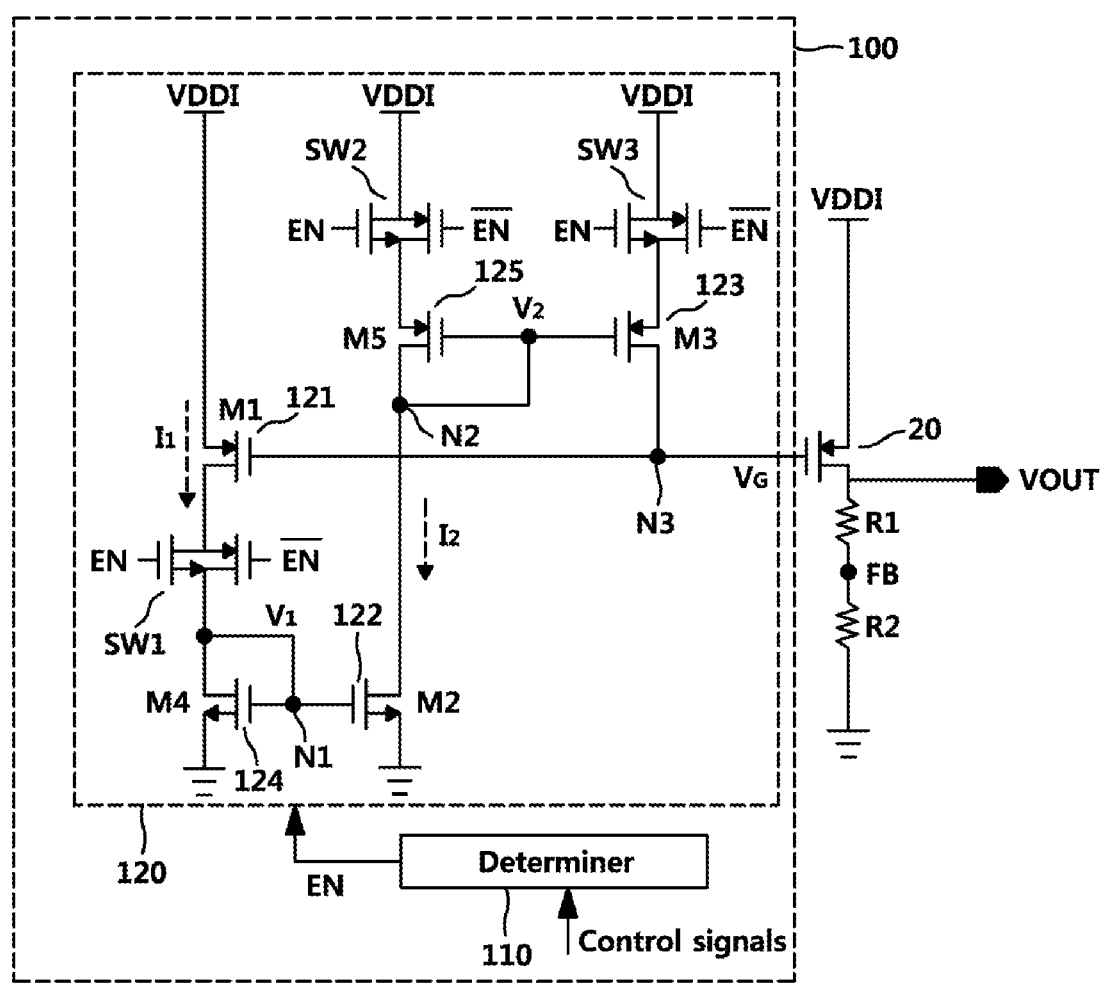
FIG. 4 illustrates an example of the limiter of the inrush preventer illustrated in the example of FIG. 2.

The limiter 120 may be implemented according to various examples, but more specifically, as per the examples of FIGS. 3 and 4.

FIG. 3 illustrates an example of the limiter of the inrush preventer illustrated in the example of FIG. 2.

The limiter 120 may include three transistors M1 to M3, three switches SW1 to SW3, and two resistors R3 and R4. The transistors M1 and M3 may each be a p-type metal-oxide-semiconductor (PMOS) transistor, and transistor M2 may be an n-type metal-oxide-semiconductor (NMOS) transistor.

The switches SW1 to SW3 may be combinations of PMOS and NMOS devices, and may be turned on and off by the enable signal and the inversion enable signal EN, $\overline{EN}$ of the determiner 110.

The gate of the transistor M1 121 may be connected to the gate of the pass transistor 20 in order to generate a mirroring current $I_1$. The transistor M1 121 may be set as having about 1/1000 size compared to the pass transistor 20, in order to regulate the amplified voltage $V_G$ according to a slight difference in the mirroring current $I_1$.

The transistor M1 121, switch SW1 and resistor R3 may serve as an I-V or current-voltage converter that may convert the input current $I_1$ to voltage $V_1$.

The switch SW1 may be connected between the drain terminal of the transistor M1 121 and a node N1, that is, a node N1 at an end of the resistor R3.

The resistor R3 may be connected between the node N1 and the ground terminal in order to convert the mirroring current $I_1$, generated through the transistor M1 121, into the voltage $V_1$. The switch SW2, the resistor R4, and the transistor M2 122 may serve as a V-I or voltage-current converter, and may convert the input voltage $V_1$ into a current $I_2$.

The switch SW2 may be connected between the power input terminal VDDI and the node N2, that is, a node at one end of the resistor R4, where the switch SW2 may be turned on and off according to the enable signal and the inversion enable signal EN, $\overline{EN}$ of the determiner 110, in order to apply a voltage into the drain terminal of the transistor M2. The other end of the resistor R4, that is, the node N2 and the drain terminal, may be connected to the transistor M2 122, and a source terminal may be connected to a power ground terminal GND. The transistor M2 122 may generate a current $I_2$ when voltage $V_1$ is applied to the gate. The resistor R4 may output the current $I_2$ generated by the transistor M2 122 as the voltage $V_2$.

The input voltage $V_2$ may be applied to the gate of the transistor M3 123, and based on the change in the drain-source voltage of the transistor M3 123 based on the switching of the switch SW3, the transistor M3 123 may output a regulated amplified voltage $V_G$ into the gate terminal of the pass transistor 20.

The switch SW3 may be connected between the power input terminal VDDI and the source terminal of the transistor M3. The drain terminal of the transistor M3 may be connected to a node such as the gate terminal of the pass transistor 20 and to the gate terminal of the transistor M1 121.

FIG. 4 illustrates an example of the limiter of the inrush preventer illustrated in the example of FIG. 2.

The limiter 120 of the example of FIG. 4 differs from the limiter 120 of the example of FIG. 3 in that the limiter 120 of the example of FIG. 4 may include five transistors and three switches, without resistors. For example, the transistors M1, M3, and M5 may be PMOS transistors, and the transistors M2 and M4 may be NMOS transistors.

The switches SW1 to SW3 may be turned on and off by the enable signal and inversion enable signal EN, $\overline{EN}$ of the determiner 110. The transistor M1 121 may have a source terminal connected to a power input terminal VDDI, a drain terminal connected to one end of the switch SW1, and a gate connected to a gate terminal of a pass transistor 20.

The transistor M1 121 may generate a mirroring current $I_1$ of the pass transistor 20. The transistor M1 121 may be set as having about 1/1000 size compared to the pass transistor 20, so that the amplified voltage $V_G$ may be regulated according to a slight difference in the mirroring current $I_1$.

The transistor M4 124 may have a drain terminal connected to the node N1, and may have a source terminal connected to the power ground terminal GND. The other end of the switch SW1, the drain terminal and the gate terminal of the transistor M4 124 may be connected to the node N1.

The transistor M2 122 may have a drain terminal connected to the node N2, may have a source terminal connected to the power ground terminal GND, and may have a gate terminal connected to the node N1. The transistor M2 122 may generate a mirroring current $I_2$ for the current $I_1$ of the transistor M4.

The transistor M5 125 may have a drain terminal and a gate terminal connected to the node N2, and may have a source terminal is connected to one end of the switch SW2. The other end of the switch SW2 may be connected to the power input terminal VDDI.

The switch SW3 may have one end connected to the power input terminal VDDI and the other end may be connected to the source terminal of the transistor M3 123. Transistor M3 123 may have a drain terminal connected to node N3 and may have a gate terminal connected to node N2.

The transistor M3 123 may convert the current $I_2$ mirrored by the transistor M5 125 into the regulated amplified voltage $V_G$ of the pass transistor 20, and may output such a current into the gate terminal of the pass transistor 20.

Figure 5:
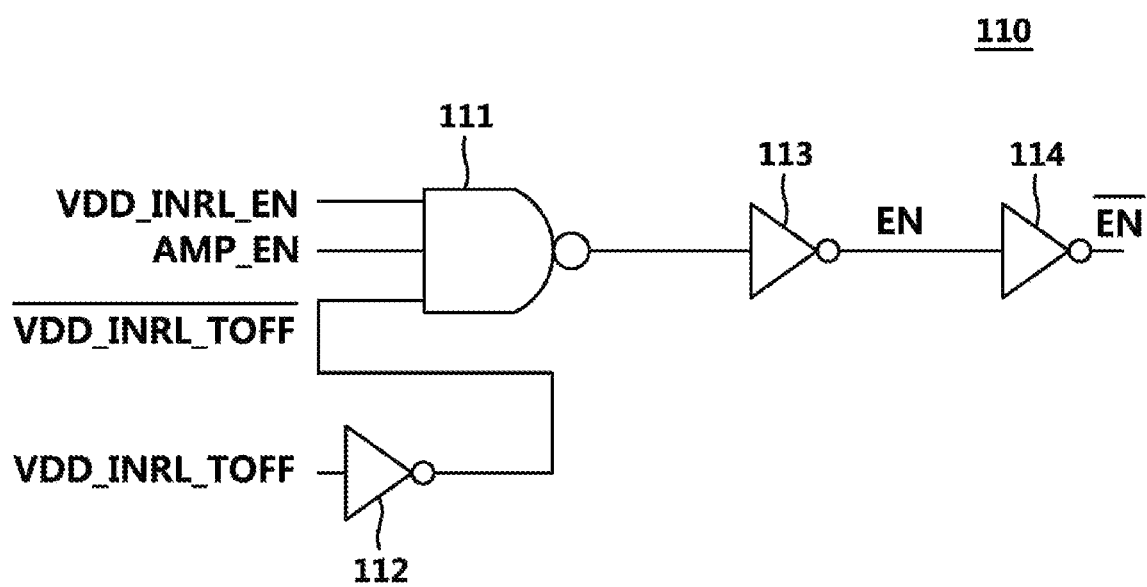
FIG. 5 illustrates an example of the determiner of the inrush preventer illustrated in the example of FIG. 2.
Figure 6:
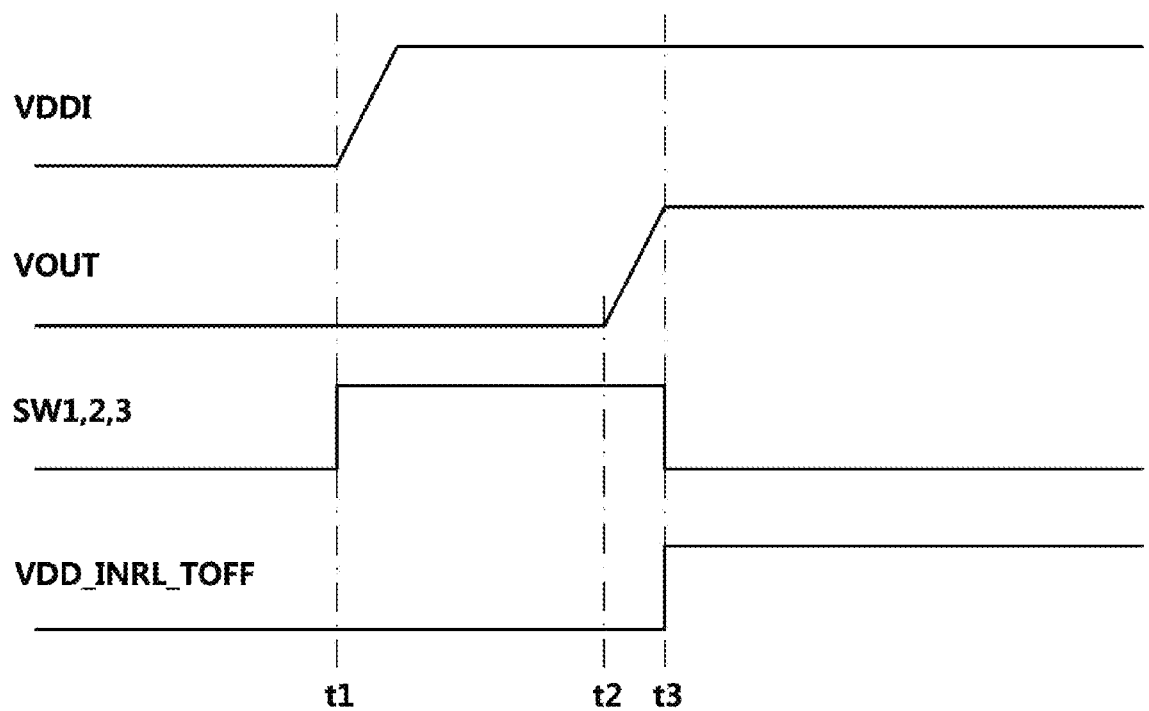
FIG. 6 is a signal timing diagram for describing an operation of the LDO circuit according to the example of FIG. 5.

FIG. 5 illustrates an example of the determiner of the inrush preventer illustrated in the example of FIG. 2. FIG. 6 is a signal timing diagram for describing an operation of the LDO circuit according to the example of FIG. 5.

The determiner 110 may include an NAND circuit 111, a first inverter 113, a second inverter 114 and a third inverter 112, as a non-limiting example. The determiner 110 may receive an inrush enable signal VDD_INRL_EN, an amplifier enable signal AMP_EN, an inrush disable signal, or an inversion inrush disable signal VDD_INRL_TOFF, $\overline{\text{VDD\_INRL\_TOFF}}$ in order to output a enable signal or inversion enable signal EN, $\overline{\text{EN}}$.

The NAND circuit 111 may receive the inrush enable signal VDD_INRL_EN, the amplifier enable signal AMP_EN, and the inversion inrush disable signal $\overline{\text{VDD\_INRL\_TOFF}}$, and may output the inversion enable signal $\overline{\text{EN}}$ through the first inverter 113 and the second inverter 114. The third inverter 112 may receive the inrush disable signal VDD_INRL_TOFF, and may output the inversion inrush disable signal $\overline{\text{VDD\_INRL\_TOFF}}$ into the NAND circuit 111.

Inrush enable signal VDD_INRL_EN may be a signal that determines whether or not to use the inrush preventer 100, and may always be fixed as having a value of 1 when the inrush preventer 100 is used.

The amplifier enable signal AMP_EN may be a signal used for driving the differential amplifier 10 included in the LDO circuit.

The inrush disable signal VDD_INRL_TOFF may be a signal used for determining whether or not to stop the driving of the inrush preventer 100.

Table 1 below shows the operating states of the determiner illustrated in the examples of FIGS. 5 and 6.

To describe Table 1 in more detail, the enable signal and the inversion enable signal EN and $\overline{\text{EN}}$ of the determiner 110 may turn on and off the switches SW1 to SW3 illustrated in the examples of FIGS. 3 and 4. Referring to the example of FIG. 6, the LDO circuit may not operate because the power input voltage VDDI may be in a low state before the time t1. However, when the LDO circuit is switched from the low state to the high state at the time t1, the inrush enable signal VDD_INRL_EN and the amplifier enable signal AMP_EN may change state from 0 to 1. Accordingly, the switches SW1 to SW3 may be changed from a state of OFF to a state of ON, and the inrush preventer 100 may start driving.

At the time t2, the output voltage VOUT of the pass transistor 20 may start to gradually change from a Low value to a High value, and when the output voltage VOUT reaches the High state at the time t3, the inrush disable signal VDD_INRL_TOFF may be changed from 0 to 1 and the enable signal EN may be changed from 1 to 0. At the time t3 the switches SW1 to SW3 may be turned from a state of ON to a state of OFF, and the inrush preventer 100 may stop driving.

In the examples of FIGS. 5 and 6, the initial driving period may last from the time when the inrush enable signal and the amplifier enable signal are turned on to the time when the inrush disable signal is turned on.

Figure 7:
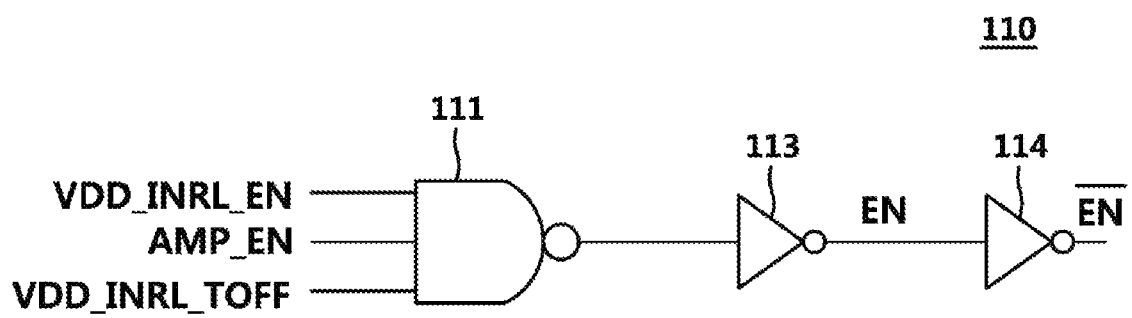
FIG. 7 illustrates an example of the determiner illustrated in the example of FIG. 2.
Figure 8:
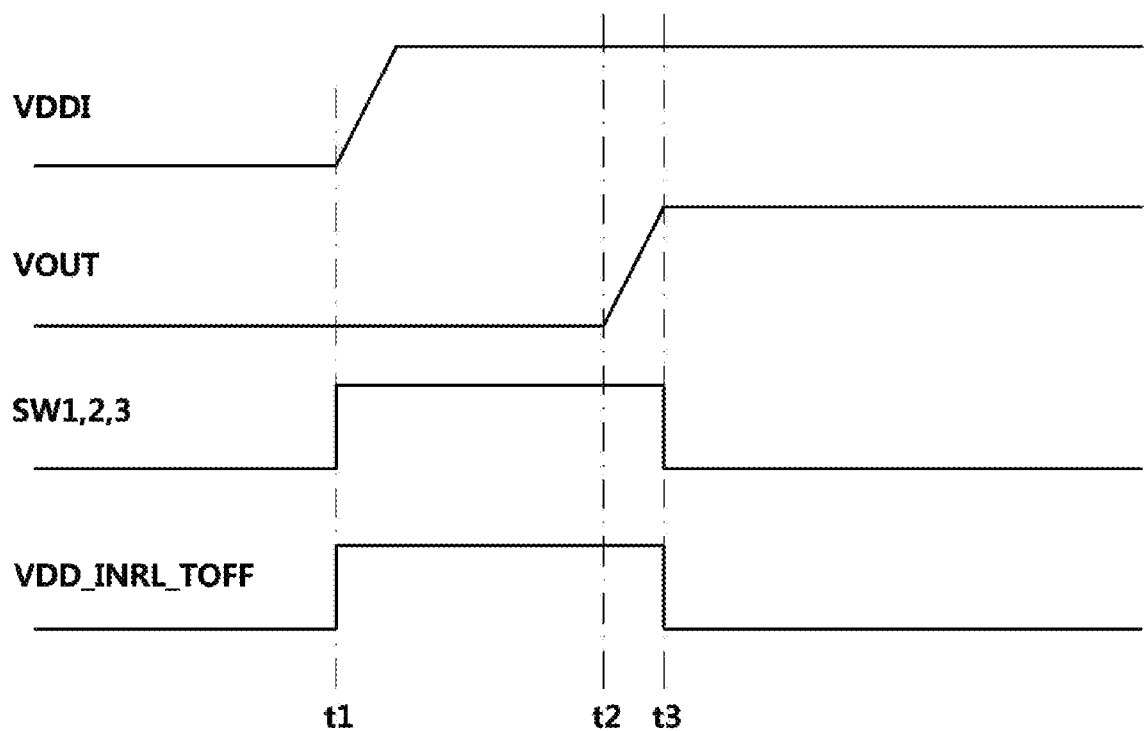
FIG. 8 is a signal timing diagram for describing an operation of the LDO circuit according to the example of FIG. 7.

FIG. 7 illustrates an example of the determiner illustrated in the example of FIG. 2. FIG. 8 is a signal timing diagram for describing an operation of the LDO circuit according to the example of FIG. 7. For convenience of description, the differences of the examples of FIG. 7 and FIG. 8 from the examples of FIG. 5 and FIG. 6 are principally described.

Referring to the example of FIG. 7, the determiner may include an NAND circuit 111, a first inverter 113 and a second inverter 114, as a non-limiting example. The example of FIG. 7 may differ from the example of FIG. 5 in that the inversion inrush disable signal $\overline{\text{VDD\_INRL\_TOFF}}$ may not be an input of the NAND circuit 111.

When described in further detail with reference to Table 2 below, there may be a difference in that the enable signal EN and the inversion enable signal $\overline{\text{EN}}$ are changed, as compared to Table 1 of the example of FIG. 5.

However, because the switches SW1 to SW3 are switched by receiving both the enable signal EN and the inversion enable signal $\overline{\text{EN}}$, only the switching synchronization time is different, and the overall operation is the same as that of the example of FIG. 5.

TABLE 1

| VDD_INRL_EN | AMP_EN | VDD_INRL_TOFF | $\overline{\text{VDD\_INRL\_TOFF}}$ | EN | $\overline{\text{EN}}$ | State |
|---|---|---|---|---|---|---|
| 0 | 0 | 0 | 1 | 0 | 1 | OFF |
| 1 | 0 | 0 | 1 | 0 | 1 | OFF |
| 1 | 1 | 0 | 1 | 1 | 0 | ON |
| 1 | 1 | 1 | 0 | 0 | 1 | OFF |

TABLE 2

| VDD_INRL_EN | AMP_EN | VDD_INRL_TOFF | EN | $\overline{EN}$ | State |
|---|---|---|---|---|---|
| 0 | 0 | 0 | 0 | 1 | OFF |
| 1 | 0 | 0 | 0 | 1 | OFF |
| 1 | 1 | 0 | 0 | 1 | OFF |
| 1 | 1 | 1 | 1 | 0 | ON |

Referring to Table 2 and the example of FIG. 8, when the power input voltage VDDI is converted from a Low value to a High value at the time t1, the inrush enable signal VDD_INRL_EN and the amplifier enable signal AMP_EN may be changed from 0 to 1. Because the inrush disable signal VDD_INRL_TOFF is 1, the enable signal EN may become 1, and accordingly, the switches SW1 to SW3 may be changed from a state of OFF to a state of ON, and the inrush preventer 100 may start driving.

At the time t2, the output voltage VOUT of the pass transistor 20 may start to gradually change from a Low value to a High value, and when the output voltage VOUT reaches the High value at the time t3, the inrush disable signal VDD_INRL_TOFF may be changed from 1 to 0, the enable signal EN may be changed from 1 to 0, and the switches SW1 to SW3 may be turned from a state of ON to a state of OFF, and the inrush preventer 100 may stop driving.

In the examples of FIGS. 7 and 8, the initial driving period lasts from the time when the inrush enable signal and the amplifier enable signal are turned on to the time at which the inrush disable signal is turned off.

Figure 9:
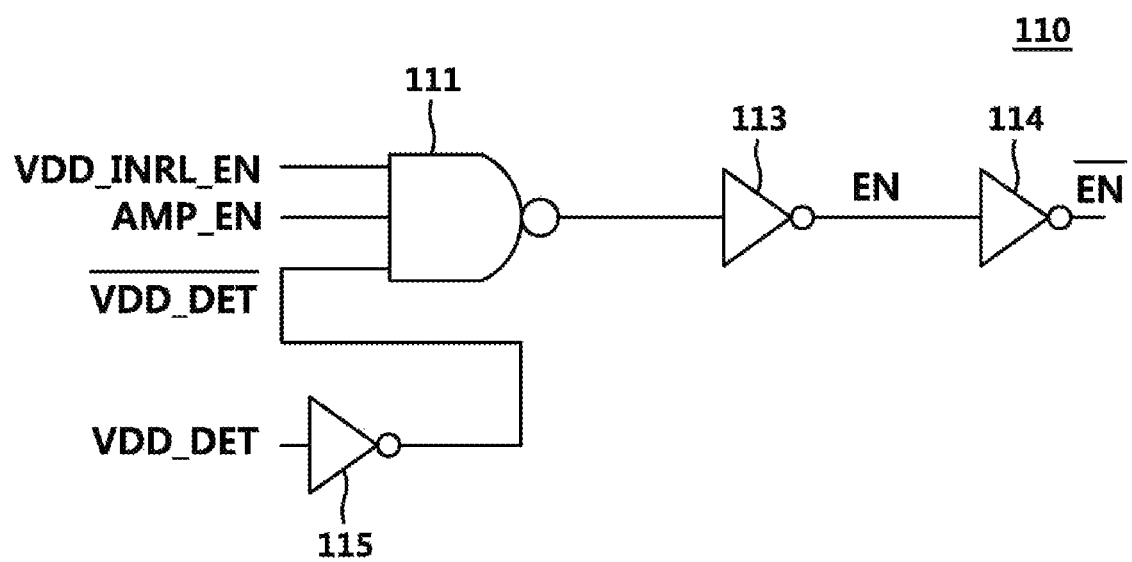
FIG. 9 illustrates an example of the determiner illustrated in the example of FIG. 2.
Figure 10:
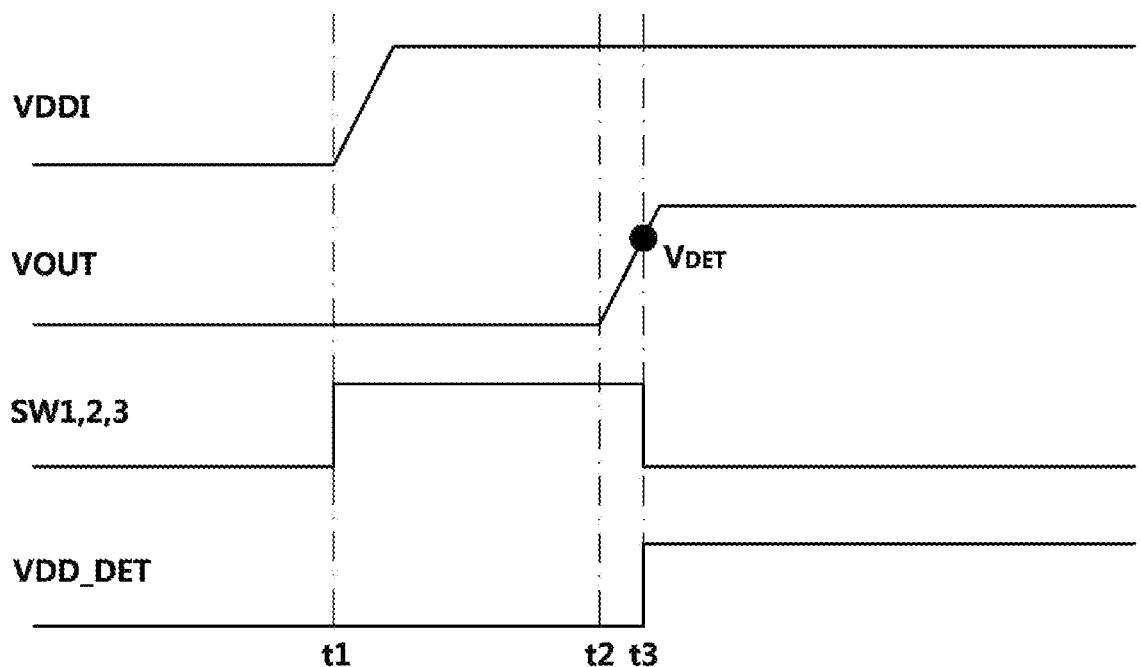
FIG. 10 is a signal timing diagram for describing an operation of the LDO circuit according to the example of FIG. 9.

FIG. 9 illustrates an example of the determiner illustrated in the example of FIG. 2. FIG. 10 may be a signal timing diagram for describing the operation of the LDO circuit of the example of FIG. 9. For convenience of description, differences from the examples of FIGS. 5 to 8 are principally described.

Referring to the example of FIG. 9, the determiner 110 may include an NAND circuit 111, a first inverter 113, a second inverter 114, and a third inverter 115, as a non-limiting example. The example of FIG. 9 may differ from the example of FIG. 5 in that the detection signal VDD_DET is used in the determiner 110, not the inrush disable signal VDD_INRL_TOFF.

The detection signal VDD_DET may be a signal output when the output voltage VOUT of the pass transistor 20 reaches the threshold voltage $V_{DET}$, after the low dropout voltage regulator starts driving. According to an example, the detection signal VDD_DET may be output using a voltage level detector. For example, the threshold voltage $V_{DET}$ may be about 70% or more of the maximum output voltage VOUT of the pass transistor 20.

Table 3 below shows the operating states of the example illustrated in the examples of FIGS. 9 and 10.

TABLE 3

| VDD_INRL_EN | AMP_EN | VDD_DET | EN | $\overline{EN}$ | state |
|---|---|---|---|---|---|
| 0 | 0 | 0 | 0 | 1 | OFF |
| 1 | 0 | 0 | 0 | 1 | OFF |
| 1 | 1 | 0 | 1 | 0 | ON |
| 1 | 1 | 1 | 0 | 1 | OFF |

The description of the operation states of Table 3 is omitted because the description is similar to that of Table 1 with respect to FIG. 5, except that the detection signal VDD_DET is input instead of the inrush disable signal VDD_INRL_TOFF.

In the examples of FIGS. 9 and 10, the initial driving period may last from the time when the inrush enable signal and the amplifier enable signal are turned on to the time at which the detection signal is turned on.

Figure 11:
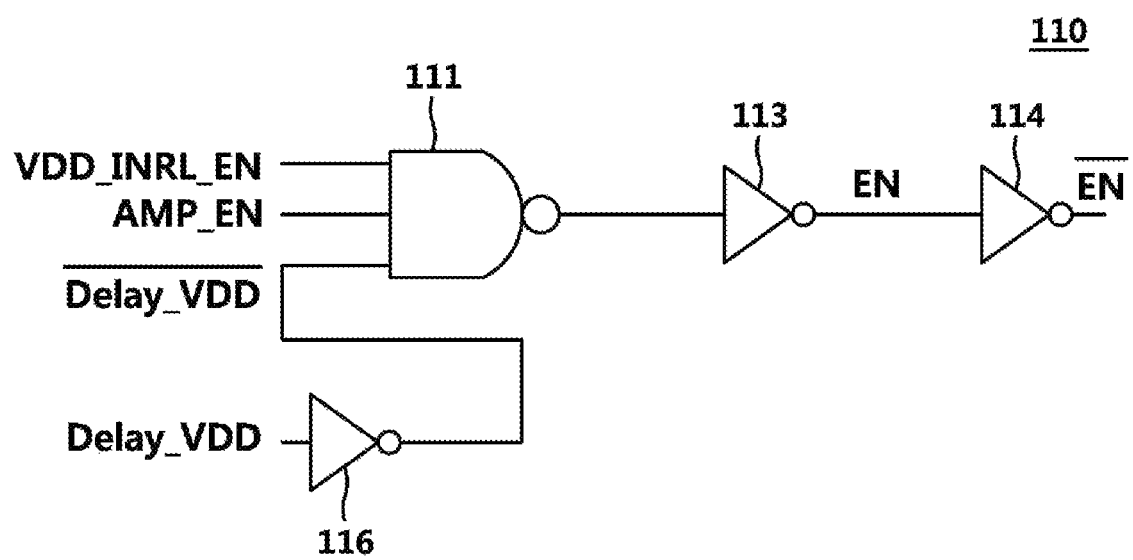
FIG. 11 illustrates an example of the determiner illustrated in the example of FIG. 2.
Figure 12:
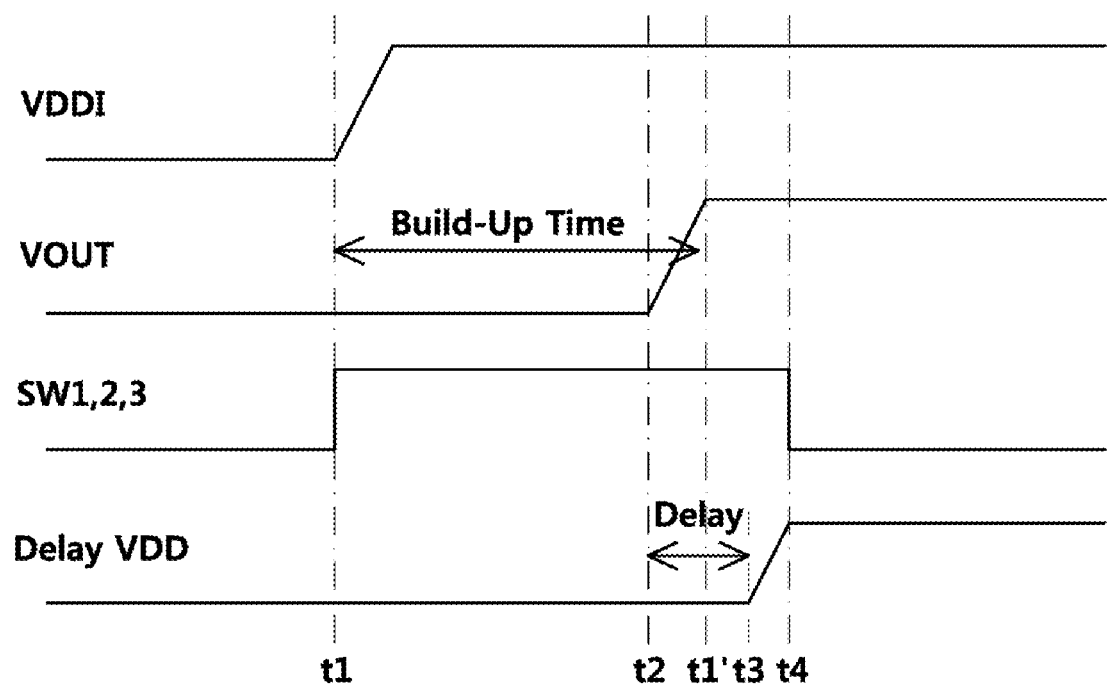
FIG. 12 is a signal timing diagram for describing an operation of the LDO circuit according to the example of FIG. 11.

FIG. 11 illustrates an example of the determiner illustrated in the example of FIG. 2. FIG. 12 is a signal timing diagram for describing an operation of the LDO circuit according to the example of FIG. 11. For convenience of description, differences from the examples of FIGS. 5 and 10 are principally described.

Referring to the example of FIG. 11, the determiner 110 may include an NAND circuit 111, a first inverter 113, a second inverter 114, and a third inverter 116, according to a non-limiting example. The example of FIG. 11 may not use the inrush disable signal VDD_INRL_TOFF, unlike the example of FIG. 5, and may not use the detection signal VDD_DET, unlike the example of FIG. 9. The example of FIG. 11 may instead use a delay signal Delay_VDD as an input signal of the third inverter 116.

The delay signal Delay_VDD may be a signal that is RC delay by receiving the output voltage of the low dropout voltage regulator as feedback and may be turned on after the build-up time of the pass transistor 20 elapses.

A build-up time may last from the time t1 at which the power input voltage VDDI is input to the time t1' at which the output voltage VOUT of the LDO circuit reaches the target voltage or saturation voltage. Referring to the example of FIG. 12, the delay period Delay may last from the time t2 at which the output voltage VOUT of the pass transistor 20 begins to be changed from a Low value to a High value to the time t3, which is a predetermined time after the output voltage VOUT reaches a High value. Because an RC delay is used, the time t3 may vary depending on the size of the capacitance of the capacitor. Such an RC delay is provided by use of a resistor operating in conjunction with a capacitor.

Table 4 below shows the operating state of the fourth example illustrated in the example of FIG. 11. The description of the operation states of Table 4 is omitted because the description is similar to that associated with Tables 1 and 3, but the delay signal Delay_VDD is used instead of the inrush disable signal VDD_INRL_TOFF or the detection signal VDD_DET.

TABLE 4

| VDD_INRL_EN | AMP_EN | Delay_VDD | EN | $\overline{EN}$ | state |
|---|---|---|---|---|---|
| 0 | 0 | 0 | 0 | 1 | OFF |
| 1 | 0 | 0 | 0 | 1 | OFF |
| 1 | 1 | 0 | 1 | 0 | ON |
| 1 | 1 | 1 | 0 | 1 | OFF |

In the examples of FIGS. 11 and 12, the initial driving period may last from the time when the inrush enable signal and the amplifier enable signal are turned on to the time at which the delay signal is turned on.

Figure 13:
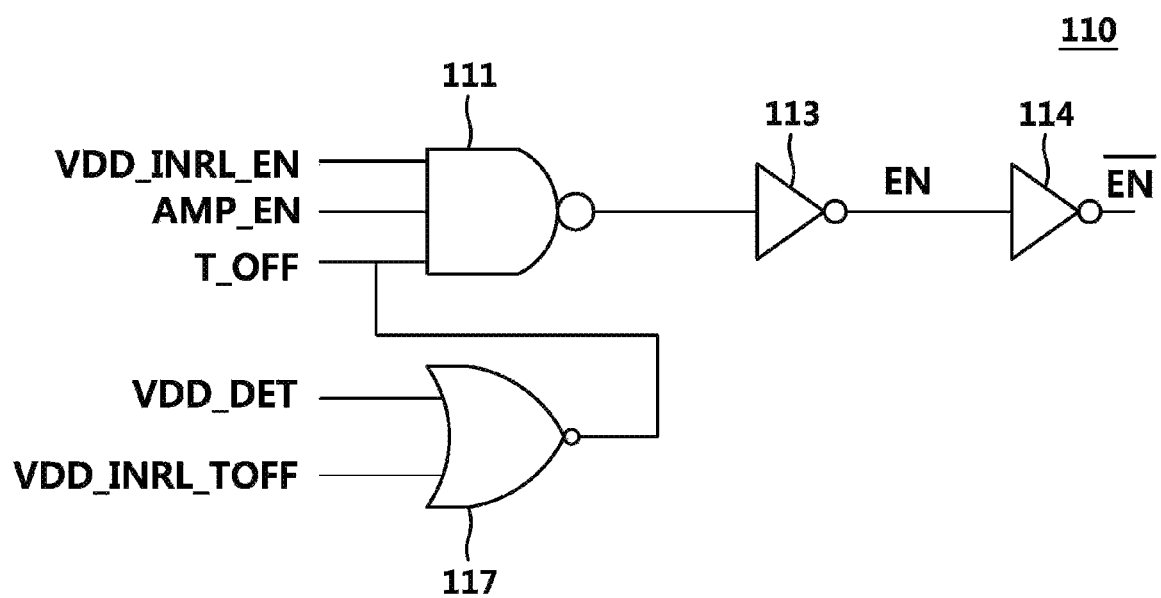
FIG. 13 illustrates an example of the determiner illustrated in the example of FIG. 2
Figure 14:
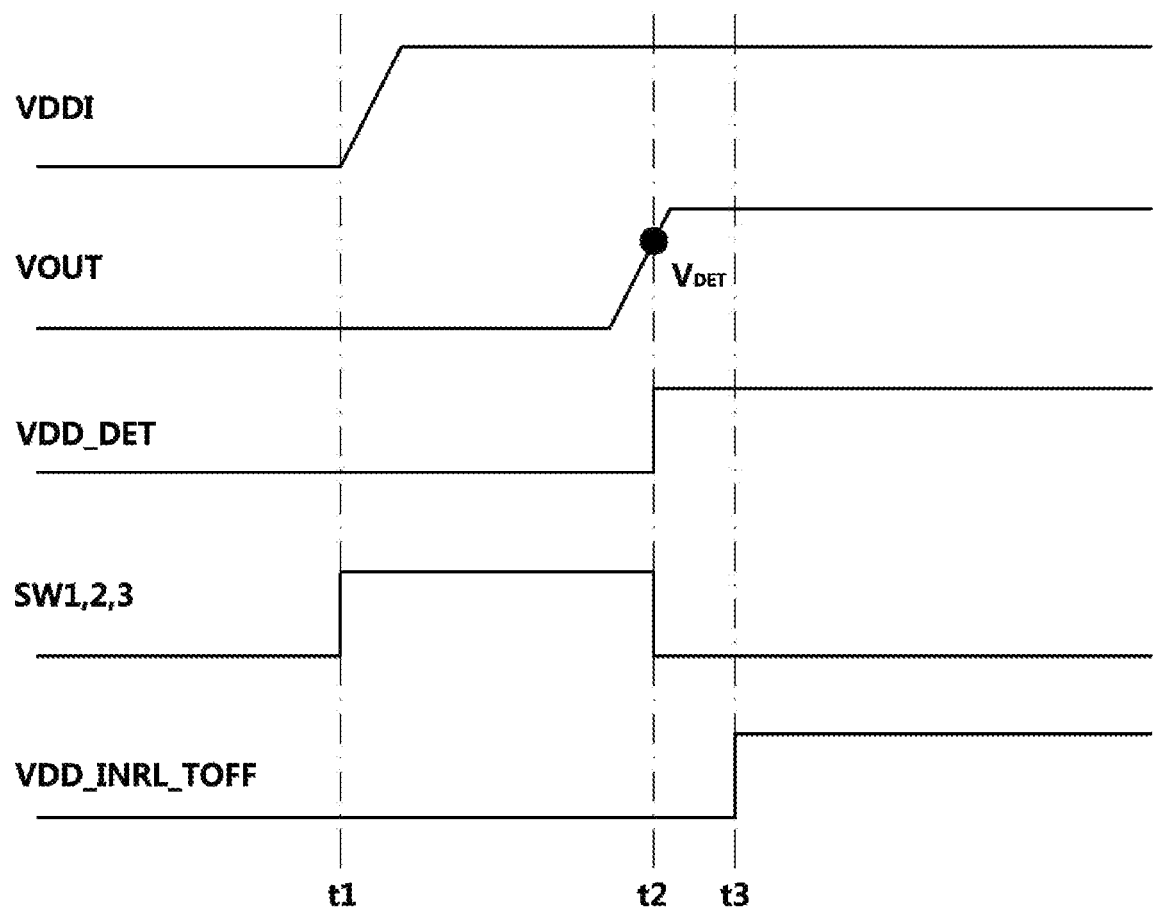
FIG. 14 is a signal timing diagram for describing an operation of the LDO circuit of the example of FIG. 13.

FIG. 13 illustrates an example of the determiner illustrated in the example of FIG. 2. FIG. 14 is a signal timing diagram for describing an operation of the LDO circuit of the example of FIG. 13. For convenience of description, differences from the examples of FIGS. 5 to 12 are principally described.

Referring to the example of FIG. 13, the determiner 110 may include an NAND circuit 111, a first inverter 113, a second inverter 114, and a NOR circuit 117, as a non-limiting example. Unlike the example of FIGS. 5 to 12, the example of FIG. 13 may use both the inrush disable signal VDD_INRL_TOFF and the detection signal VDD_DET.

The example of FIG. 13 may use the output signal T_OFF of the NOR circuit 117 as an input of the NAND circuit 111. The NOR circuit 117 may cause the inrush preventer 100 to drive when both the detection signal VDD_DET and the inrush disable signal VDD_INRL_TOFF are 0, and when either of these two signals is 1, the inrush preventer 100 may stop driving. Table 5 below shows an operating state of the example illustrated in FIG. 13.

TABLE 5

| VDD_INRL_EN | AMP_EN | VDD_INRL_TOFF | VDD_DET | T_OFF | EN | $\overline{EN}$ | state |
|---|---|---|---|---|---|---|---|
| 1 | 0 | 0 | 0 | 1 | 0 | 1 | OFF |
| 1 | 1 | 0 | 0 | 1 | 1 | 0 | ON |
| 1 | 1 | 0 | 1 | 0 | 0 | 1 | OFF |
| 1 | 1 | 1 | 1 | 0 | 0 | 1 | OFF |
| 1 | 1 | 1 | 0 | 0 | 0 | 1 | OFF |

By connecting the inrush disable signal VDD_INRL_TOFF and the detection signal VDD_DET to the NOR circuit 117, the inrush preventer 100 may not be turned on again even when the output voltage VOUT of the pass transistor 20 is unstable when going down from the threshold voltage VDET after the end of driving of the inrush preventer 100, because the inrush disable signal VDD_INRL_TOFF may become 1. Descriptions of other operating states according to Table 5 are similar to those of Tables 1 to 4, and thus descriptions thereof are omitted, for brevity. In the examples of FIGS. 13 and 14, the initial driving period may last from the time at which the inrush enable signal and the amplifier enable signal are turned on to the time at which the detection signal is turned on. Further, the inrush disable signal VDD_INRL_TOFF is turned on after a predetermined time elapses after the detection signal VDD_DET is turned on.

Figure 15:
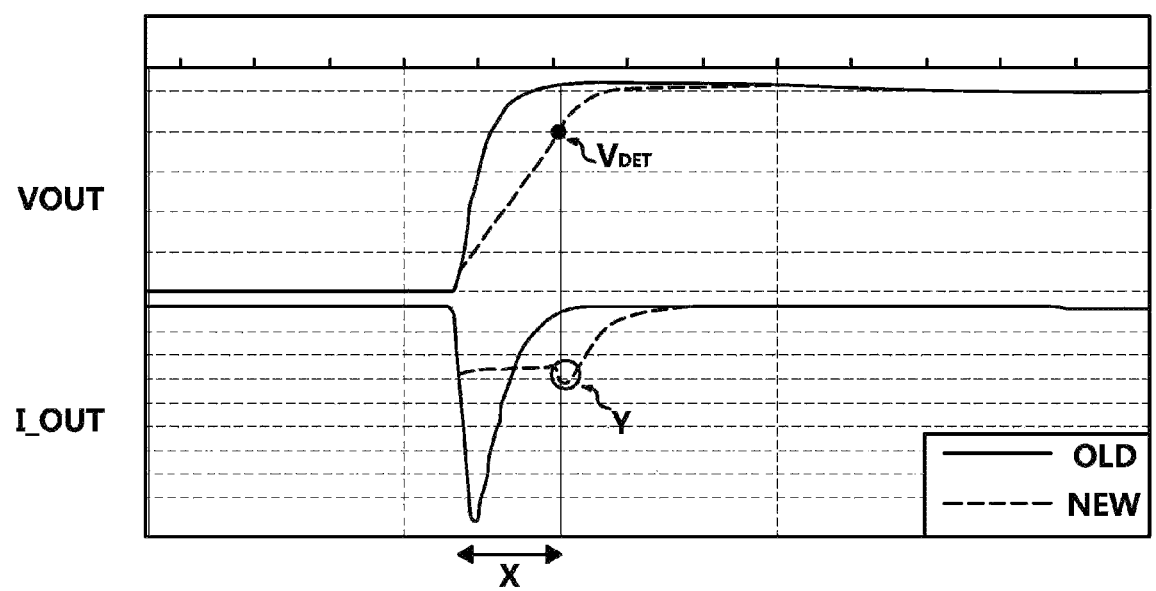
FIG. 15 is a signal diagram illustrating an output voltage and an output current according to the operation of a low dropout voltage regulator of an example.

FIG. 15 is a signal diagram illustrating an output voltage and an output current according to the operation of the low dropout voltage regulator of an example.

Referring to the example of FIG. 15, by using the inrush preventer 100 of the examples, the output current I_OUT due to the inrush current generated during the initial driving of the LDO circuit may be reduced to ⅓ of its value. Accordingly, the LDO circuit not only may have a longer initial driving time by the time interval X but also may stably output the output voltage VOUT even when the inrush current is generated.

On the other hand, the inrush current is slightly bounced at the time point Y, which is caused in order to charge the capacitor Co that is not fully charged. When the inrush preventer 100 is deactivated after the initial driving period is elapsed, the inrush preventer 100 may be stopped in the state that the output capacitor Co is not fully charged, so that the amplified voltage $V_G$ from the differential amplifier 10 may be input into the gate terminal of the pass transistor 20. The amount of the inrush current generated at this time may not affect the normal operation of the low dropout voltage regulator. If the initial drive period is set shorter by the control signal, the Y point may be earlier and the current peak level that bounces up may increase.

According to the low dropout voltage regulator circuit of the examples, the low dropout voltage regulator circuit may be protected by preventing the inrush current that is a peak current that would otherwise occur.

According to the low dropout voltage regulator circuit of the examples, the inrush current protection circuit may operate only during the initial driving of the circuit, thereby preventing a malfunction. Accordingly, the basic operation of the low dropout voltage regulator circuit, that is, the operation of the pass transistor is not interfered with.

The differential amplifier 10, pass transistor 20, inrush preventer 100, determiner 110, NAND circuit 111, first inverter 113, second inverter 114, third inverter 112, NOR circuit 117, limiter 120, transistor M1 121, transistor M2 122, transistor M3 123, transistor M4 124, and transistor M5 125 in FIGS. 1-15 that perform the operations described in this application are implemented by hardware components configured to perform the operations described in this application that are performed by the hardware components. Examples of hardware components that may be used to perform the operations described in this application where appropriate include buffers, transistors, controllers, sensors, generators, drivers, memories, comparators, arithmetic logic units, adders, subtractors, multipliers, dividers, integrators, and any other electronic components configured to perform the operations described in this application.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A low dropout voltage regulator comprising:
a differential amplifier configured to output an amplified voltage by comparing a feedback voltage with a reference voltage;
a pass transistor configured to receive a power input voltage into a source terminal, receive the amplified voltage into a gate terminal, and output an output voltage into a drain terminal;

distribution resistors connected between the drain terminal and a ground terminal, and configured to generate the feedback voltage; and an inrush preventer, connected in parallel between the differential amplifier and the pass transistor, and configured to output a regulated amplified voltage into the gate terminal during an initial driving period, wherein the inrush preventer comprises a determiner configured to output an enable signal according to control signals comprising at least three signals including an amplifier enable signal and an inrush enable signal, and a limiter configured to output the regulated amplified voltage according to the enable signal.

2. The low dropout voltage regulator of claim 1, wherein the limiter comprises:
a first switch having one end connected to a first node, and configured to be turned on and off according to the enable signal;
a first transistor having a gate terminal connected to the gate terminal of the pass transistor, a source terminal connected to the power input voltage terminal, and a drain terminal connected to the first node, and configured to generate a first mirroring current of the amplified voltage;
a first resistor configured to generate a first voltage using the first mirroring current;
a second transistor having a drain terminal connected to a second node, a source terminal connected to the ground terminal, and a gate terminal connected to the first node, and configured to generate a second mirroring current of the first voltage;
a second resistor having one end connected to the second node and configured to generate a second voltage from the second mirroring current;
a second switch connected between the power input voltage terminal and another end of the second resistor, and configured to be turned on and off according to the enable signal;
a third switch having one end connected to the power input voltage terminal, and configured to be turned on and off according to the enable signal;
and a third transistor having a gate terminal connected to the second node, a drain terminal connected to a third node, and a source terminal connected to another end of the third switch, and configured to output the regulated amplified voltage, based on the second voltage, into the gate terminal of the pass transistor.

3. The low dropout voltage regulator of claim 1, wherein the limiter comprises:
a first switch having one end connected to a first node, and configured to be turned on and off according to the enable signal;
a first transistor having a drain terminal connected to the other end of the first switch, a gate terminal connected to the gate terminal of the pass transistor, and a source terminal connected to the power input voltage terminal, and configured to generate a first mirroring current of the amplified voltage;
a second transistor having a source terminal connected to the ground terminal, a drain terminal connected to one end of the first switch, and a gate terminal connected to the first node, and configured to generate a first voltage according to the first mirroring current;
a third transistor having a drain terminal connected to a second node, a source terminal connected to the ground terminal, and a gate terminal connected to the first node, and configured to generate a second mirroring current according to the first voltage;

a fourth transistor having a drain terminal and a gate terminal connected to the second node, configured to generate a second voltage from the second mirroring current;
a second switch connected between the power input voltage terminal and a source terminal of the fourth transistor, and configured to be turned on and off according to the enable signal;
a third switch having one end connected to the power input voltage terminal and configured to be turned on and off according to the enable signal; and
a fifth transistor having a gate terminal connected to the second node, a drain terminal connected to a third node, and a source terminal connected to another end of the third switch, and configured to output the regulated amplified voltage, based on the second voltage, into the gate terminal of the pass transistor.

4. The low dropout voltage regulator of claim 1, wherein the determiner comprises:
a first inverter configured to receive and invert an inrush disable signal to output an inversion inrush disable signal; and
a NAND gate configured to receive the inrush enable signal, the amplifier enable signal, and the inversion inrush disable signal, and configured to output the enable signal.

5. The low dropout voltage regulator of claim 1, wherein the determiner comprises:
a NAND gate configured to receive the inrush enable signal, the amplifier enable signal, and an inrush disable signal, and configured to output the enable signal.

6. The low dropout voltage regulator of claim 1, wherein the determiner comprises:
a first inverter configured to receive and invert a detection signal; and
a NAND gate configured to receive the inrush enable signal, the amplifier enable signal and an inversion detection signal, and configured to output the enable signal.

7. The low dropout voltage regulator of claim 1, wherein the determiner comprises:
a NOR gate configured to receive a detection signal and an inrush disable signal; and
a NAND gate configured to receive the inrush enable signal, the amplifier enable signal, and an output signal of the NOR gate, and configured to output the enable signal.

8. The low dropout voltage regulator of claim 1, wherein the determiner comprises:
a first inverter configured to receive and invert a delay signal to output an inversion delay signal; and
a NAND gate configured to receive the inrush enable signal, the amplifier enable signal, and the inversion delay signal, and configured to output the enable signal.

9. A driving method of a low dropout voltage regulator, the driving method comprising:
outputting an output voltage of the low dropout voltage regulator based on a regulated amplified voltage generated by an inrush preventer according to control signals during an initial driving period;
comparing a feedback voltage based on the output voltage of the low dropout voltage regulator with a preset reference voltage when the initial driving period elapses; and differentially amplifying a comparison signal to output the output voltage, wherein the control signals comprise at least three signals including an inrush enable signal and an amplifier enable signal, and wherein the inrush preventer comprises a determiner configured to output an enable signal according to the control signals, and a limiter configured to output the regulated amplified voltage according to the enable signal.

10. The driving method of claim 9, wherein the initial driving period lasts from a time at which the inrush enable signal and the amplifier enable signal are turned on to a time at which an inrush disable signal is turned on.

11. The driving method of claim 9, wherein the initial driving period lasts from a time at which the inrush enable signal and the amplifier enable signal are turned on to a time at which a detection signal is turned on, and wherein the detection signal is turned on in response to the output voltage reaching a preset threshold voltage after the driving of the low dropout voltage regulator.

12. The driving method of claim 11, wherein the initial driving period ends in response to the detection signal being turned on, and wherein an inrush disable signal is turned on after a predetermined time elapses after the detection signal is turned on.

13. The driving method of claim 9, wherein the initial driving period lasts from a time at which the inrush enable signal and the amplifier enable signal are turned on to a time at which a delay signal is turned on, and wherein the delay signal is turned on after a build-up time of the pass transistor elapses.

14. A low dropout voltage regulator comprising:

a differential amplifier configured to output an amplified voltage by comparing a feedback voltage with a reference voltage;

a pass transistor configured to receive a power input voltage into a source terminal, receive the amplified voltage into a gate terminal, and output an output voltage into a drain terminal;

distribution resistors connected between the drain terminal and a ground terminal to generate the feedback voltage; and an inrush preventer connected in parallel between the differential amplifier and the pass transistor and outputting a regulated amplified voltage to the gate terminal during an initial driving period, the inrush preventer comprising a determiner that outputs an enable signal according to control signals comprising at least three signals including an amplifier enable signal and an inrush enable signal, and a limiter configured to be turned on and off based on the enable signal in order to control the amplified voltage.

15. The low dropout voltage regulator of claim 14, wherein the determiner comprises:

a first inverter configured to receive and invert an inrush disable signal to output an inversion inrush disable signal; and a NAND gate configured to receive the inrush enable signal, the amplifier enable signal, and the inversion inrush disable signal, and configured to output the enable signal.

16. The low dropout voltage regulator of claim 14, wherein the determiner comprises:

a NAND gate configured to receive the inrush enable signal, the amplifier enable signal, and an inrush disable signal, and configured to output the enable signal.

17. The low dropout voltage regulator of claim 14, wherein the determiner comprises:

a first inverter configured to receive and invert a detection signal; and a NAND gate configured to receive the inrush enable signal, the amplifier enable signal and an inversion detection signal, and configured to output the enable signal.

18. The low dropout voltage regulator of claim 14, wherein the determiner comprises:

a NOR gate configured to receiving a detection signal and an inrush disable signal; and a NAND gate configured to receive the inrush enable signal, the amplifier enable signal, and an output signal of the NOR gate, and configured to output the enable signal.

19. The low dropout voltage regulator of claim 14, wherein the determiner comprises:

a first inverter configured to receive and invert a delay signal; and a NAND gate configured to receive the inrush enable signal, the amplifier enable signal, and an inversion delay signal, and configured to output the enable signal.

20. The low dropout voltage regulator of claim 14, wherein the limiter comprises:

switches and transistors connected to one another and configured to output the regulated amplified voltage into the gate terminal of the pass transistor.

\* \* \* \* \*